(12) United States Patent
Eun

(10) Patent No.: US 8,105,497 B2
(45) Date of Patent: Jan. 31, 2012

(54) METHOD FOR FABRICATING CYLINDER TYPE CAPACITOR

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 461 days.

(21) Appl. No.: 12/492,905

(22) Filed: Jun. 26, 2009

(65) Prior Publication Data

US 2010/0159700 A1 Jun. 24, 2010

(30) Foreign Application Priority Data

Dec. 22, 2008 (KR) .................. 10-2008-0131688

(51) Int. Cl.
*H01G 4/00* (2006.01)
*H01G 5/00* (2006.01)
*H01G 9/00* (2006.01)
*H01G 13/00* (2006.01)

(52) U.S. Cl. ............. 216/6; 438/253; 438/738; 438/689
(58) Field of Classification Search ........ 216/6; 438/689, 438/738, 253, 254
See application file for complete search history.

(56) References Cited

U.S. PATENT DOCUMENTS

| 2006/0128095 A1 | 6/2006 | Tanaka et al. |
| 2006/0261393 A1 | 11/2006 | Tang et al. |
| 2009/0008743 A1 * | 1/2009 | Lee et al. ............... 257/532 |

FOREIGN PATENT DOCUMENTS

| JP | 2008-283026 A | 11/2008 |
| KR | 10-2005-0115471 | 12/2005 |
| KR | 10-0891647 | 8/2008 |
| KR | 10-2008-0086694 | 9/2008 |

* cited by examiner

*Primary Examiner* — Roberts Culbert
(74) *Attorney, Agent, or Firm* — Marshall, Gerstein & Borun LLP

(57) ABSTRACT

A method for fabricating a cylinder type capacitor includes forming connection contacts passing through a lower layer over a semiconductor substrate; forming a mold layer covering the connection contacts; forming a first floated pinning layer with a stress in a first direction over the mold layer; forming a second floated pinning layer for stress relief with a stress in a second direction over the first floated pinning layer, said second direction being opposite to the first direction; forming opening holes passing through the first and second floated pinning layers and the mold layer and exposing the connection contacts; forming storage nodes following a profile of the opening holes; removing portions of the first and second floated pinning layers to form a floated pinning layer pattern, the floated pinning layer pattern exposing a portion of the mold layer and contacting upper tips of the storage nodes; exposing outer walls of the storage nodes by selectively removing the exposed mold layer; and forming a dielectric layer and an upper electrode over the storage node.

4 Claims, 10 Drawing Sheets the first floated pinning layer and the second floated pinning layer include silicon nitride ($Si_3N_4$) having a different etch rate to the mold layer.

METHOD FOR FABRICATING CYLINDER TYPE CAPACITOR

CROSS-REFERENCE TO RELATED APPLICATIONS

Priority to Korean patent application number 10-2008-0131688, filed on Dec. 22, 2008, the disclosure of which is incorporated by reference in its entirety, is claimed.

BACKGROUND OF THE INVENTION

1. Field of the Invention

The present invention relates generally to a semiconductor device, and more particularly, to a method for fabricating a cylinder type capacitor which is capable of ensuring a capacitance.

2. Brief Description of Related Technology

With increase in an integration degree of a semiconductor device and sharp decrease of a design rule, development of a method for fabricating a capacitor which is capable of ensuring a larger capacitance within a limited area is required. In a Dynamic Random Access Memory (DRAM) device in which a cell transistor and a cell capacitor form a unit memory cell, it is necessary to ensure a larger capacitance for the improved operation of the memory.

To ensure the larger capacitance within a limited area, a storage node in a cylinder type is formed to increase the effective surface area of the capacitor. By increasing a height of a cylinder type storage node and exposing not only an inner wall of the cylindrical storage node but also an outer wall to contact with a dielectric layer, it is possible to increase an effective area of the dielectric layer.

As the height of the cylindrical node is increased and a spacing between the cylindrical nodes is narrow, falling down or leaning of the cylindrical nodes occurs in a wet etch process or a dip out process exposing the outer wall of the cylindrical node. Therefore, increasing the height of the cylindrical node is limited in the ensuring a large capacitance. To ensure a higher capacitance of the cylinder type capacitor, a method of preventing leaning of the cylindrical node is required.

SUMMARY OF THE INVENTION

Disclosed herein is a method for fabricating a cylinder type capacitor capable of a larger capacitance by preventing leaning of a cylinder type storage node.

In one embodiment, a method for fabricating a cylinder type capacitor includes forming connection contacts passing through a lower layer over a semiconductor substrate; forming a mold layer covering the connection contacts; forming a first floated pinning layer with a stress in a first direction over the mold layer; forming a second floated pinning layer for stress relief with a stress in a second direction over the first floated pinning layer, said second direction being opposite to the first direction; forming opening holes passing through the first and second floated pinning layers and the mold layer to expose the connection contacts; forming storage nodes following a profile of the opening holes; removing portions of the first and second floated pinning layers to form a floated pinning layer pattern, the floated pinning layer pattern exposing a portion of the mold layer and contacting upper tips of the storage nodes; exposing outer walls of the storage nodes by selectively removing the exposed mold layer; and forming a dielectric layer and an upper electrode over the storage node.

Preferably, the first floated pinning layer and the second floated pinning layer include silicon nitride ($Si_3N_4$) having a different etch rate to the mold layer.

Preferably, the first floated pinning layer includes a low pressure-nitride layer and the floated pinning layer includes a plasma enhanced-nitride layer.

Preferably, the mold layer includes a plasma enhanced tetraethylorthosilicate layer.

The disclosed embodiments can provide a method for fabricating a cylinder type capacitor capable of a larger capacitance by preventing leaning of a cylinder type storage node.

BRIEF DESCRIPTION OF THE DRAWINGS

For a more complete understanding of the disclosure, reference should be made to the following detailed description and accompanying drawings, wherein.

Figure 1:
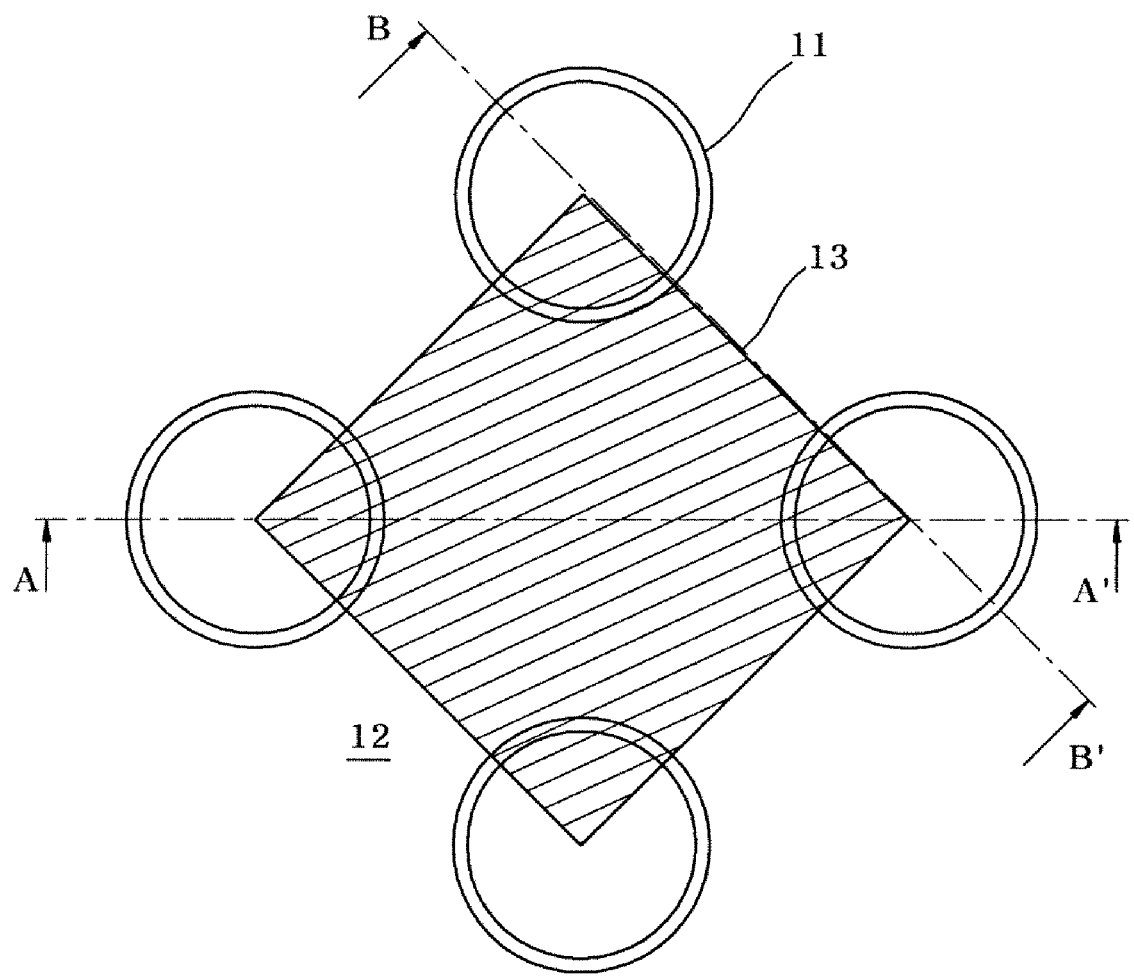
FIGS. 1 through 9 are views illustrating a method for fabricating a cylinder type capacitor in accordance with an embodiment of the invention.

While the disclosed method is susceptible of embodiments in various forms, specific embodiments are illustrated in the drawings (and will hereafter be described) with the understanding that the disclosure is not intended to limit the invention to the specific embodiment described and illustrated herein.

DESCRIPTION OF SPECIFIC EMBODIMENTS

Disclosed herein is a method for fabricating a cylinder type storage node for ensuring a capacitance of a memory device such as a DRAM device, and exposing an outer wall of the cylinder type storage node, thereby realizing an increase in an effective area of a dielectric layer. To prevent bridge by leaning or falling down of cylindrical nodes caused by a dip out process or wet etch process for exposing the outer wall of the cylinder type storage node and any subsequent drying process, a floated pinning layer for tying and supporting the cylinder type storage node with adjacent cylinder type storage nodes is introduced. Since several adjacent cylinder type storage nodes are maintained in a connected state by the introduction of this floated pinning layer, it is possible to prevent the falling down of the cylinder type storage nodes in the wet etch process. Since it is possible to prevent the falling down of the cylinder type storage node, it is possible to increase a height or an aspect ratio of the cylinder type storage node.

The floated pinning layer can be formed including an insulation material, e.g. silicon nitride ($Si_3N_4$), having an etch selectivity to a mold layer, which is introduced as a sacrificial layer to provide a shape of the cylinder type storage node. This silicon nitride layer can be formed of Low Pressure (LP)-nitride, and LP-nitride layer is accompanied with a considerably high tensile stress. The LP-nitride layer is measured with a tensile stress of about 1E10 dyne/$cm^2$. By this tensile stress, a crack can be generated between the floated pinning layer and the cylinder type storage node, and current leakage between the storage node and an upper electrode can be led through this crack. When the crack is generated, deposition of the dielectric layer at a portion around the crack becomes irregular and the current leakage can be caused through such portion where the dielectric layer is not deposited or deposited to a relatively thin thickness.

To relieve the stress of the floated pinning layer, a Plasma Enhanced TetraEthylOrthoSilicate (PE-TEOS) layer accompanied with a compressive stress can be introduced, but this PE-TEOS layer has an etch rate similar to that of the silicon oxide layer, which forms the mold layer, and thus can be removed together with the removal of the mold layer. When the PE-TEOS layer is removed, an upper tip of the cylinder type storage node is exposed above the floated pinning layer and a shape of this upper tip is quite sharp. This horn can be broken when the dielectric layer is deposited over the horn of the cylinder type storage node having such sharp shape. The break of the horn causes bridge between the storage nodes.

In one embodiment, to relieve the stress on this floated pinning layer and prevent the break of the horn of the storage node, the floated pinning layer is introduced as a stack of layers accompanied with stresses in different directions. At this time, the layers forming the stack are made of insulation materials, all of them having similar etch selectivities to the mold layer. Therefore, it is possible to prevent some portion of the floated pinning layer from being etched and removed together in a process of removing the mold layer and thus prevent the upper tip of the cylinder type storage node attached to the floated pinning layer from being projected above the floated pinning layer. Therefore, it is possible to prevent the storage node over the floated pinning layer from being largely projected and thus significantly lower the height of the horn of the storage node. Consequently, it is possible to prevent the horn portion of the storage node from being broken.

FIGS. 1 through 9 are views illustrating a method for fabricating a cylinder type capacitor in accordance with an. FIG. 10 is a view explaining the effect of the method for fabricating the cylinder type capacitor in accordance with an embodiment.

Referring to FIG. 1, in one embodiment, a floated pinning layer for tying and supporting adjacent storage nodes 11 is introduced at an upper tip of the cylindrical storage node 11, and a mask pattern 13 for patterning this floated pinning layer is introduced in such a shape that the mask pattern 13 is partially overlapped with the storage nodes 11. A layout of the mask pattern 13 is designed to provide a pattern shape of the floated pinning layer and can have, besides a grating shape as illustrated in FIG. 1 in which lozenge shapes are repeated, various layouts including a shape in which linear bands intersect horizontally or vertically with each other, a shape in which linear bands extending in a horizontal direction or a vertical direction are connected to each other at a tip boundary or a shape in which linear bands extend in a diagonal direction. This mask pattern 13 can be varied to various layouts provided that the floated pinning layer has a shape tying the storage nodes 11 and also maintains a shape exposing the portion 12 of the mold layer in a space between the storage nodes 11.

A cut line A-A' in FIG. 1 is for showing a section of a portion where the floated pinning layer is maintained, and a cut line B-B' is for showing a section of a portion where the floated pinning layer is selectively removed. A method for fabricating the cylinder type capacitor in accordance with an embodiment will be described with reference to FIGS. 2 through 9 illustrating the sections taken along the cut lines A-A' and B-B'.

Figure 2:
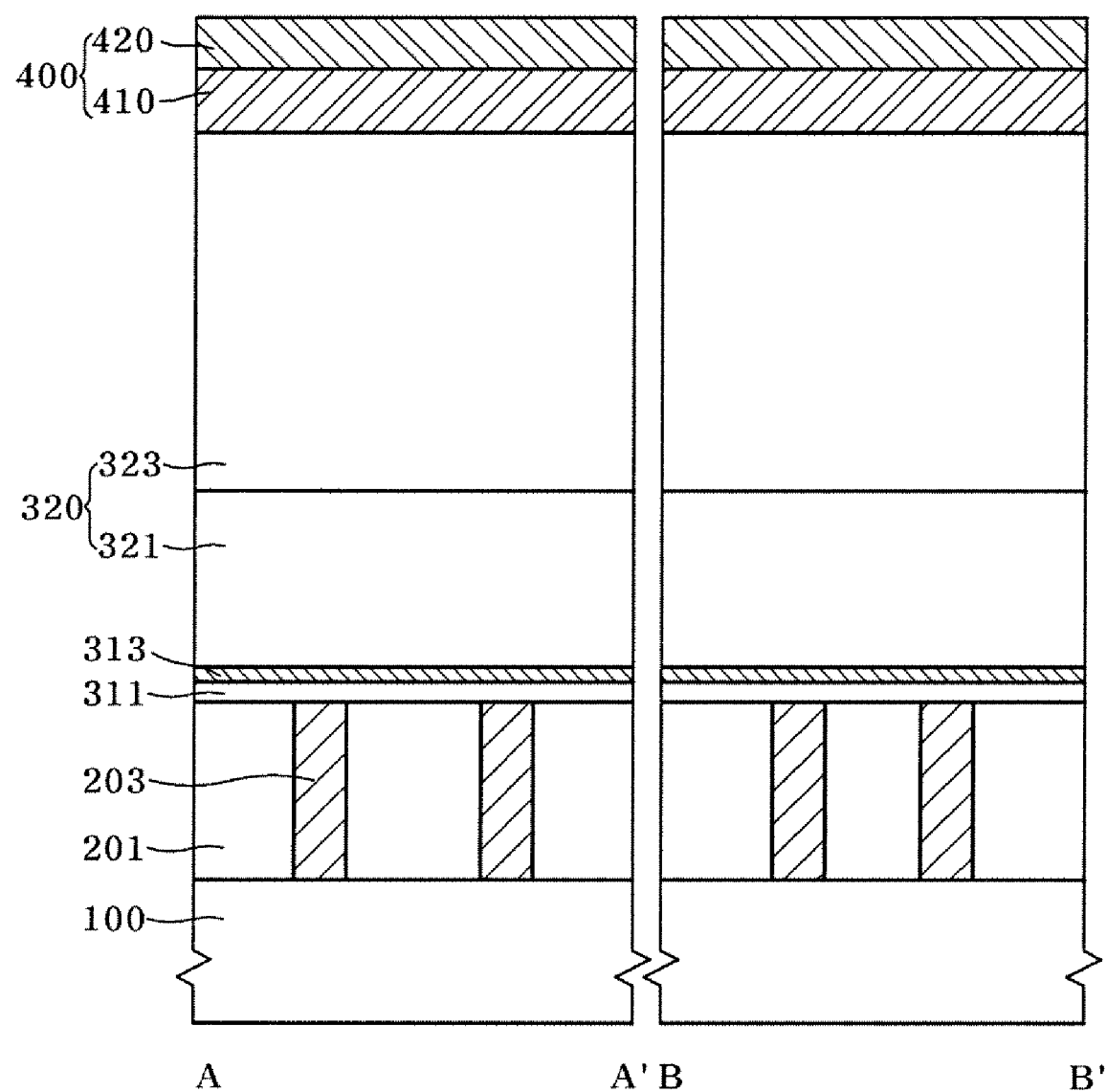

Referring to FIG. 2, a process of forming a cell transistor, which constitutes a memory cell of a DRAM device, over a semiconductor substrate 100 is performed. For example, a Shallow Trench Isolation (STI) process is performed on the semiconductor substrate 100 and a transistor (not illustrated) is realized over an active region, followed by the formation of an insulation layer 201 which covers the transistor, as a lower layer. A connection contact which passes through the insulation layer 201 is formed as a storage node contact 203.

An etch stop layer 313 is formed over the storage node contact 203 and a mold layer 320 for giving a concave cylinder shape to the storage node is formed as a sacrificial layer. The etch stop layer 313 can be formed including an insulation material, e.g. silicon nitride ($Si_3N_4$), having an etch selectivity to silicon oxide ($SiO_2$) layer, which constitutes the mold layer 320, so that the etch stop layer 313 functions as a etch stop point upon patterning of the mold layer 320. A lower support layer 311 for supporting a cylindrical storage node can be formed below the etch stop layer 313 as a buffer layer of an insulation material, such as a silicon oxide layer.

The mold layer 320 can be formed of a stack of a multiple insulation layers, each having different etch rate, so that it is possible to open the bottom even though an opening hole which will give the shape of the cylindrical storage node has a deeper depth. For example, the mold layer 320 can be formed of a stack including a first mold layer 321 of a Phosphorous Silicate Glass (PSG) layer having a relatively high etch rate and a second mold layer 323 of a PE-TEOS layer having a relatively low etch rate. The first mold layer 321 is deposited to a thickness of about 3000 to 5000 Å and the second mold layer 323 is deposited to a thickness of about 10000 to 14000 Å A planarization process using Chemical Mechanical Polishing (CMP) is performed on the second mold layer 323 to polish the second mold layer 323 by about 1000 Å. This planarization process induces an effect of improving a process margin in a subsequent photolithography process.

A floated pinning layer 400 is formed on the mold layer 320. The floated pinning layer 400 is formed of silicon nitride ($Si_3N_4$) and the mold layer 320 is formed of a silicon oxide based insulating materials. The silicon nitride ($Si_3N_4$) has a different etch rate from that of the silicon oxide. The floated pinning layer 400 is introduced so that it is patterned to be in contact with an upper outer face of the storage node and functions to tie a plurality of adjacent storage nodes. Since a plurality of the storage nodes are tied to one another, the falling down of the storage nodes in the subsequent etch process or the full dip out process for selectively removing the mold layer 320 can be prevented.

The floated pinning layer 400 can be formed of a stack of multiple layers accompanied with stresses in different directions. For example, a first floated pinning layer 410 accompanied with a stress in a first direction can be formed including a layer of LP-nitride accompanied with a tensile stress. The LP-nitride layer can be accompanied with a relatively high tensile stress, e.g., a tensile stress of about 1E10 dyne/$cm^2$ due to the low pressure deposition.

A crack due to this tensile stress can be generated in an interface with the PE-TEOS layer which forms the mold layer 320. To prevent the crack, a second floated pinning layer 420 accompanied with a stress in a second direction, which is an opposite direction to the first direction, i.e. a compressive stress, is deposited over the first floated pinning layer 410. The second floated pinning layer 420 can be deposited of a (PE) plasma enhanced nitride layer accompanied with a compressive stress. The first floated pinning layer 410 is deposited to a thickness of about 750 to 850 Å, and the second floated pinning layer 420 for the stress relief is deposited to a thickness of about 1300 Å. The PE-nitride layer can relieve the tensile stress generated in the first floated pinning layer 410 since the PE-nitride layer is accompanied with a compressive stress of about −2E9 dyne/$cm^2$. Since it is possible to prevent the generation of the crack due to the stress by the introduction of the second floated pinning layer 420, it is possible to prevent current leakage of the capacitor.

Figure 3:
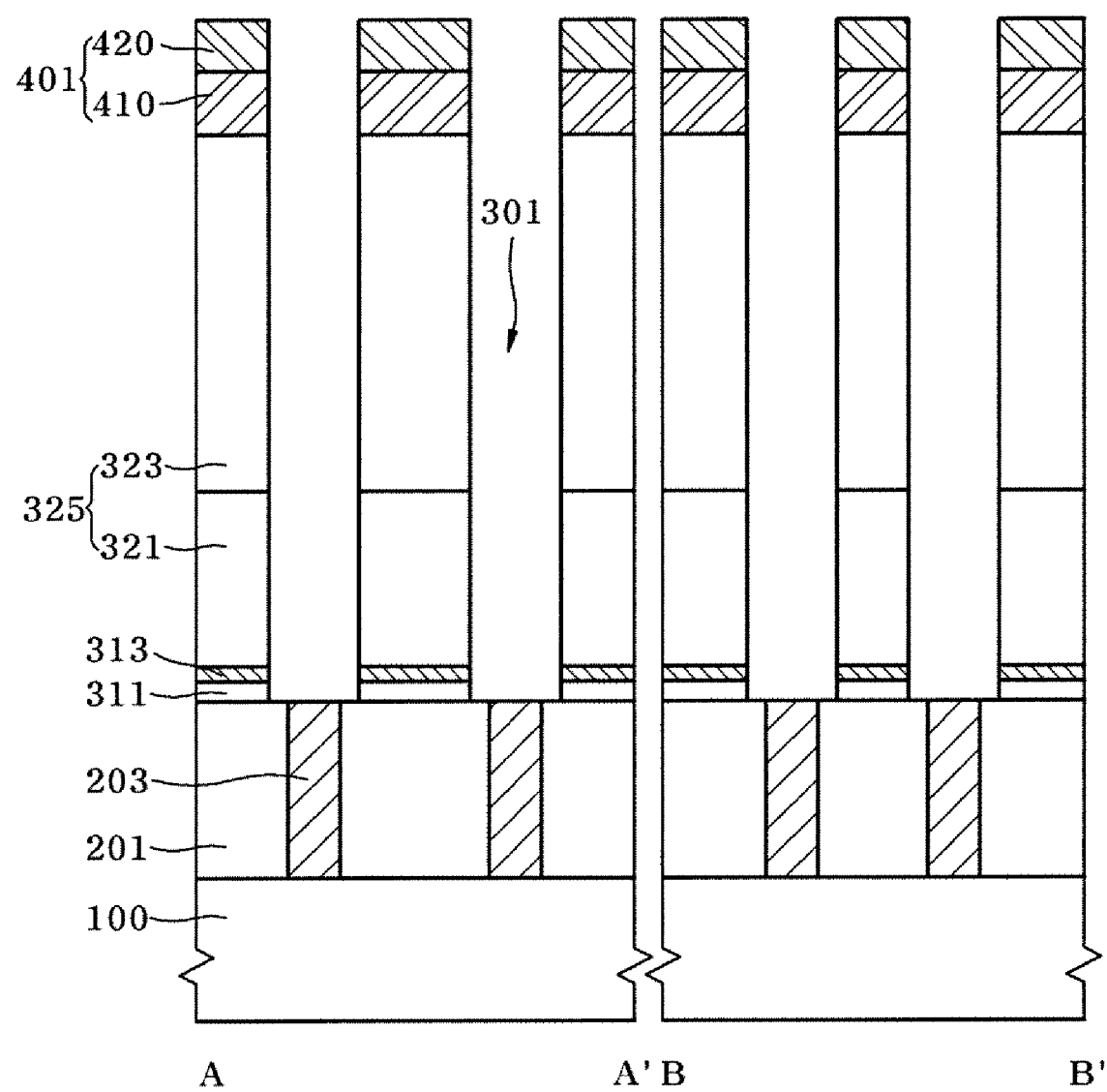

Referring to FIG. 3, an opening hole 301 which passes through the floated pinning layer 400 and the mold layer 320 is formed by a selective etch process. By the formation of this opening hole 301, the mold layer pattern 325 is formed and a first pattern 401 of the floated pinning layer is formed. The etch of the opening hole 301 is performed by a dry etch, which is terminated on the etch stop layer 313, and the etch stop layer 313 is additionally etched to expose the storage node contact 203 therebelow.

Figure 4:
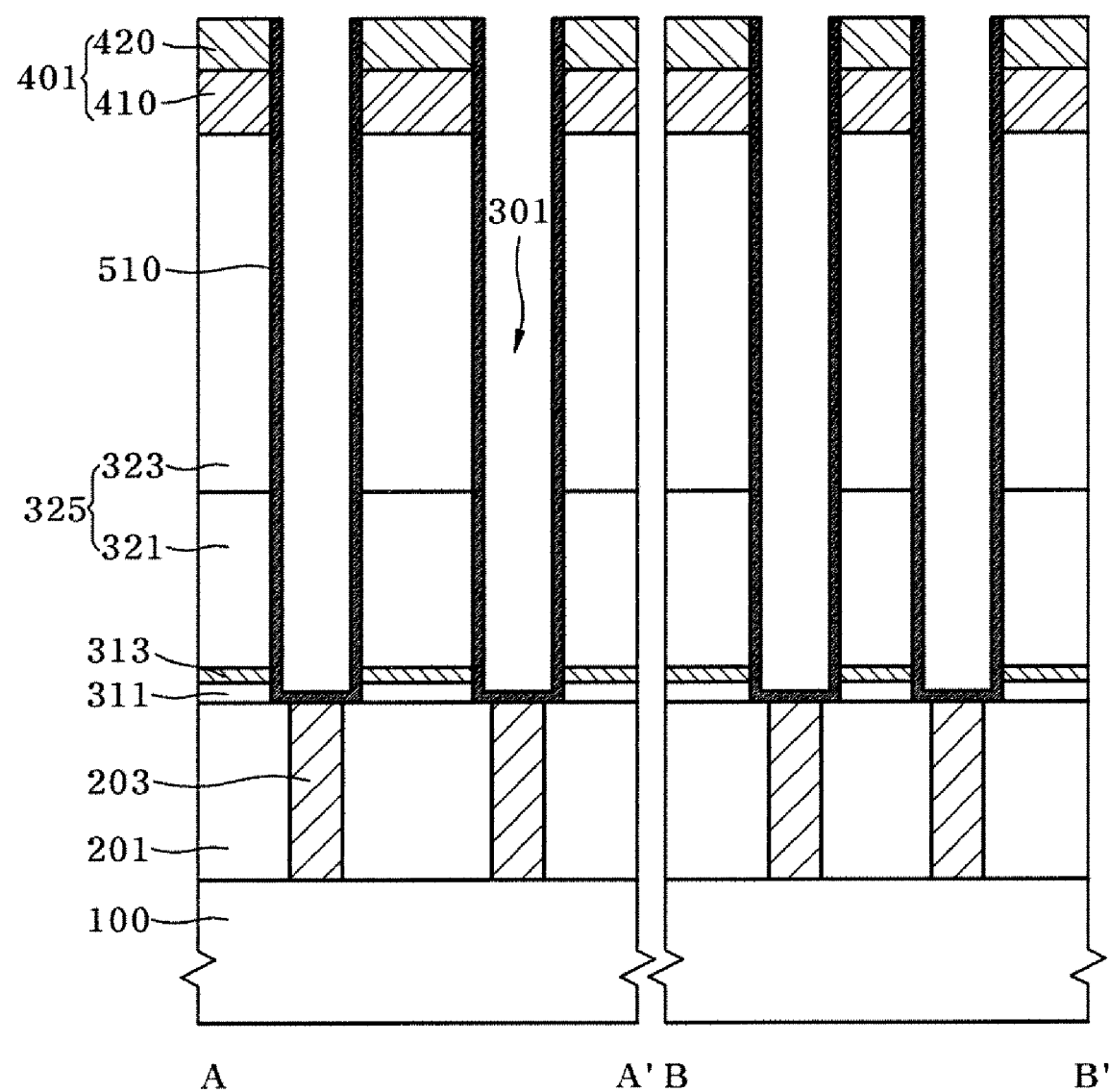

Referring to FIG. 4, a cylindrical storage node 510 having a concave portion is formed following a profile of the opening hole 301. After a metal layer for the storage node 510, e.g., a titanium nitride (TiN) layer accompanied with a titanium layer as a barrier metal layer, a node isolation process using CMP process is performed to isolate the storage node 510.

Figure 5:
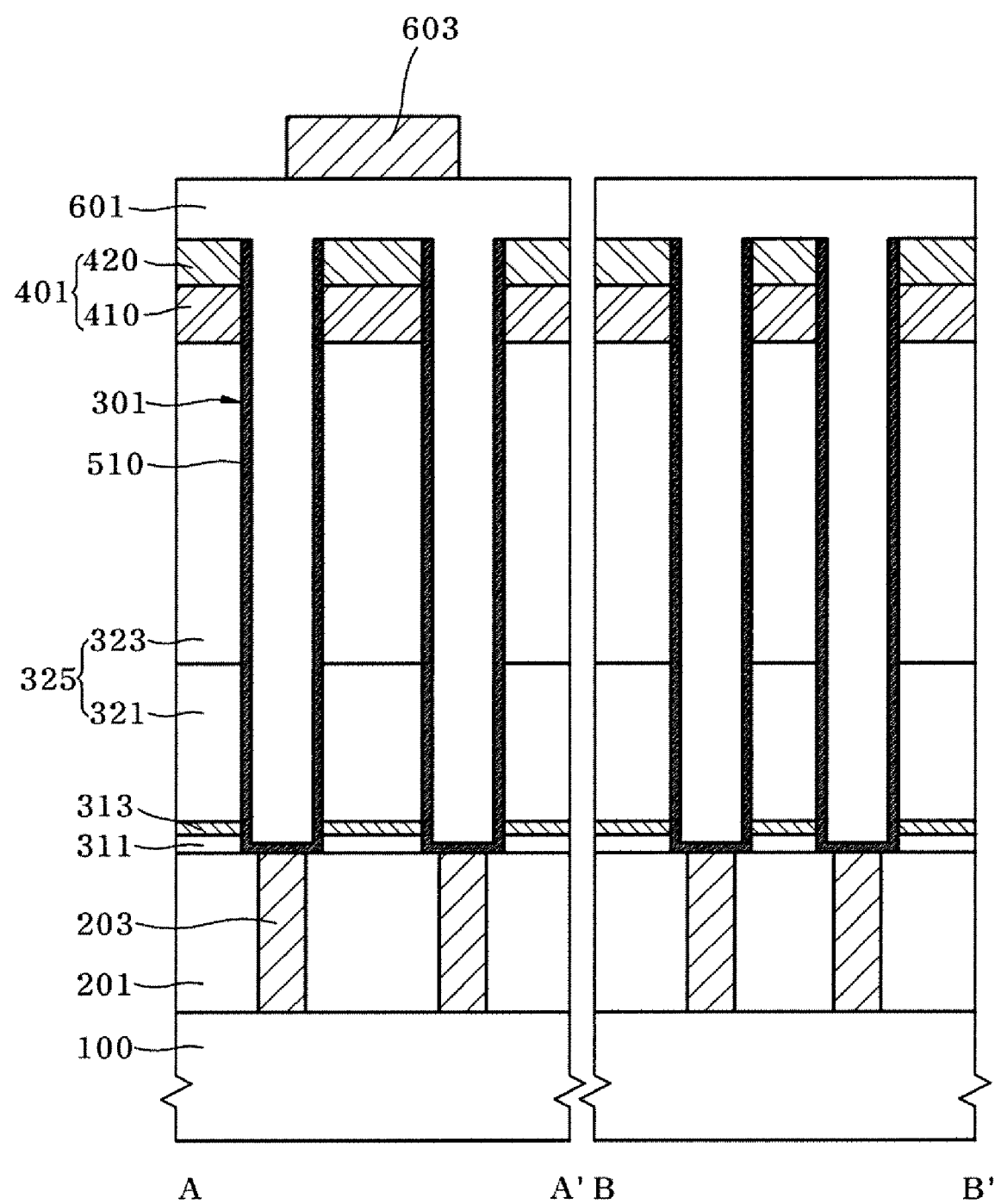

Referring to FIG. 5, a mask 603 for a selective etch process for removing some portion of the first pattern 401 of the floated pinning layer is formed. Prior to the formation of the mask 603, a capping layer 601 is formed including a silicon oxide ($SiO_2$) layer to fill the opening hole 301. This capping layer 601 fills the opening hole 301 and thus functions to prevent damage to the storage node 510 by exposure during the subsequent etch process. The mask 603 can be formed including a photoresist pattern formed by exposure and developing processes. At this time, to obtain a planar underlayer prior to the formation of the photoresist pattern, the capping layer 601 which fills the opening hole 301 and covers the first pattern 401 of the floated pinning layer, is formed as a sacrificial layer.

Figure 6:
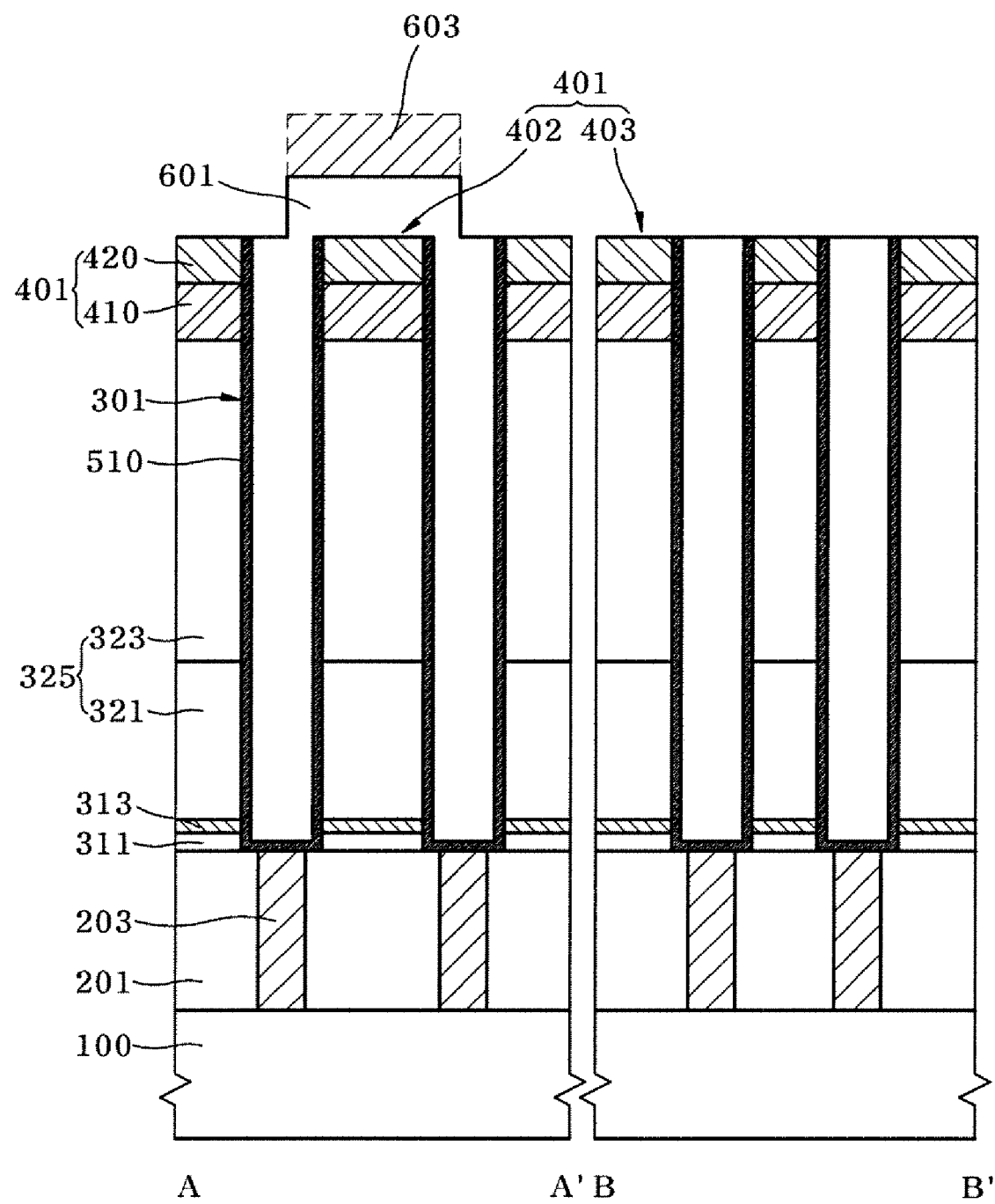
Figure 7:
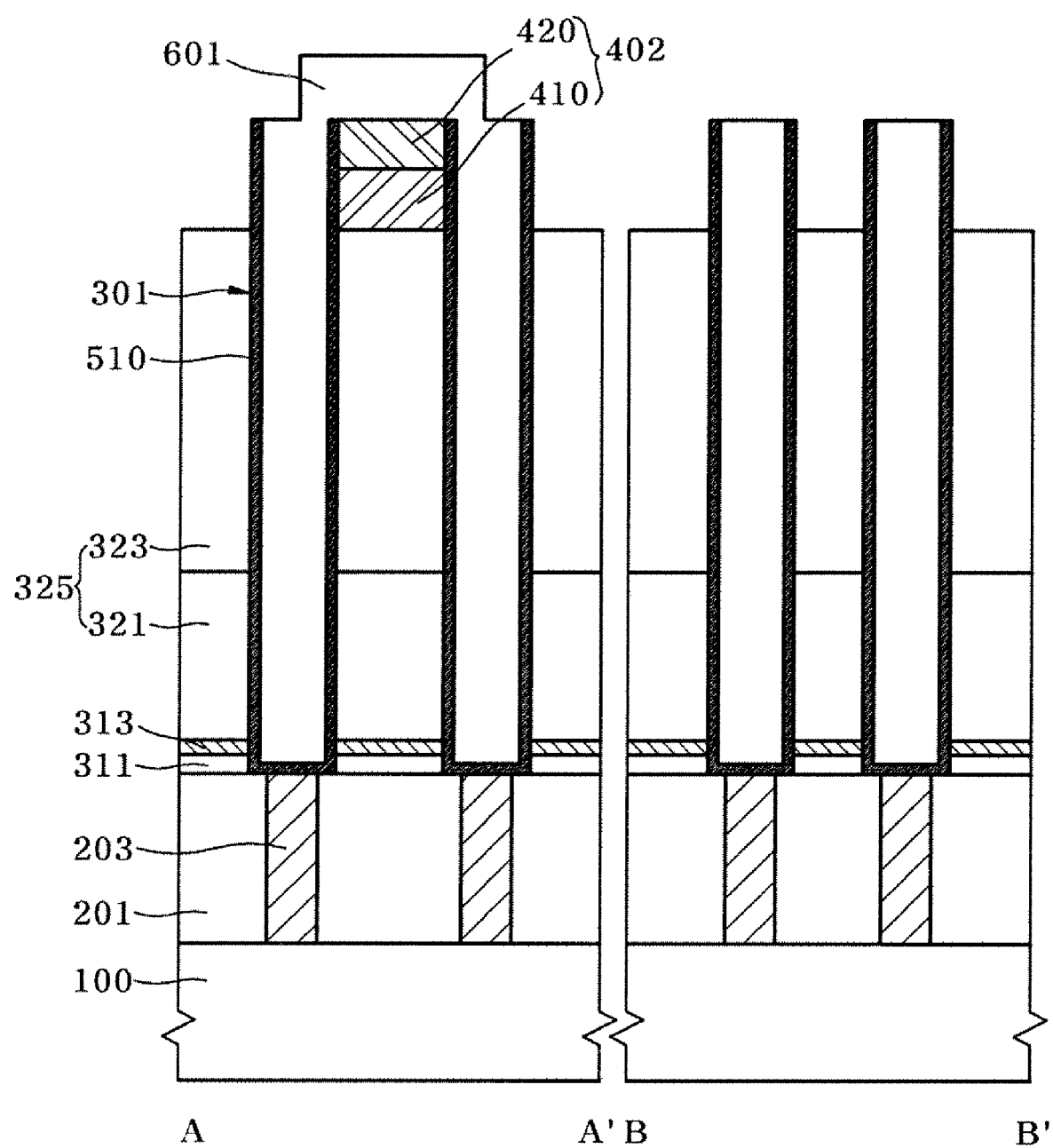

Referring to FIG. 6, the portion of the capping layer 601 exposed by the mask 603 is selectively etched to cover a first portion 402 of the first pattern 401 of the floated pinning layer and expose a second portion 403. The exposed second portion 403 of the first pattern of the floated pinning layer is selectively etched to expose the mold layer pattern 325 therebelow as illustrated in FIG. 7. Consequently, the first portion 402 of the first pattern remains as a second pattern 402.

Figure 8:
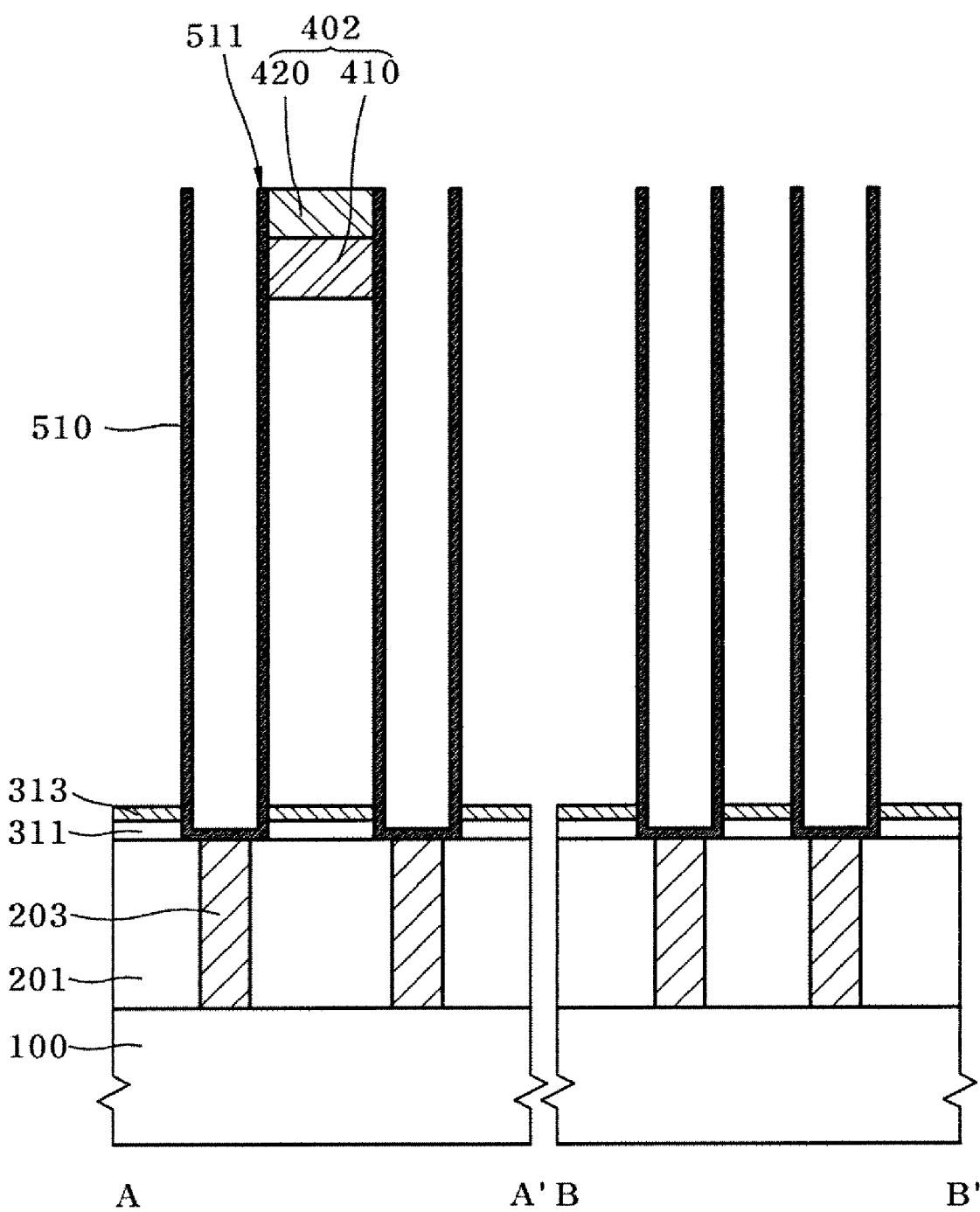

Referring to FIG. 8, a wet etch process for selectively removing the mold layer pattern 325 is performed. The wet etch process can be performed in a full dip out process using an oxide etchant for removing oxide, e.g. diluted fluoric acid or a Buffer Oxide Etchant (BOE). Upon the removal of the mold layer pattern 325, the second pattern 402 of the floated pinning layer, formed including silicon nitride, remains by the etch selectivity and functions to tie and support adjacent storage nodes 510. Since the second floated pinning layer 420 of the second pattern 402 also remains, projection of the upper tip 511 of the storage node 510 over the second floated pinning layer is prevented. The second floated pinning layer 420 is in contact with the upper tip 511 of the storage node 510.

Since the projection of the upper tip 511 of the storage node 510 above the second floated pinning layer 420 is prevented, it is possible to prevent this upper tip 511 from forming a horn and breaking in subsequent processes. When the second floated pinning layer 420 is formed of silicon oxide based material such as a PE-TEOS layer, as illustrated in FIG. 10, the PE-TEOS layer 23 over the floated pinning layer 21 is removed together upon the wet etch of the mold layer pattern 325. Therefore, the tip 24 of the TiN electrode, which is the storage node 25, is exposed to form a horn. Consequently, the tip 24 of this storage node 25 can be broken in subsequent processes. Unlike this case, the upper tip 511 of the storage node 510 in accordance with an embodiment of the present invention as illustrated in FIG. 8 remains in the form attached to a side wall of the second floated pinning layer 420. Therefore, the upper tip 511 is not projected to form a horn and breaking of the tip 511 is thus prevented. Consequently, it is possible to prevent bridge and resulting current leakage due to the break of the upper tip 24 of the storage node (25 of FIG. 10).

Figure 9:
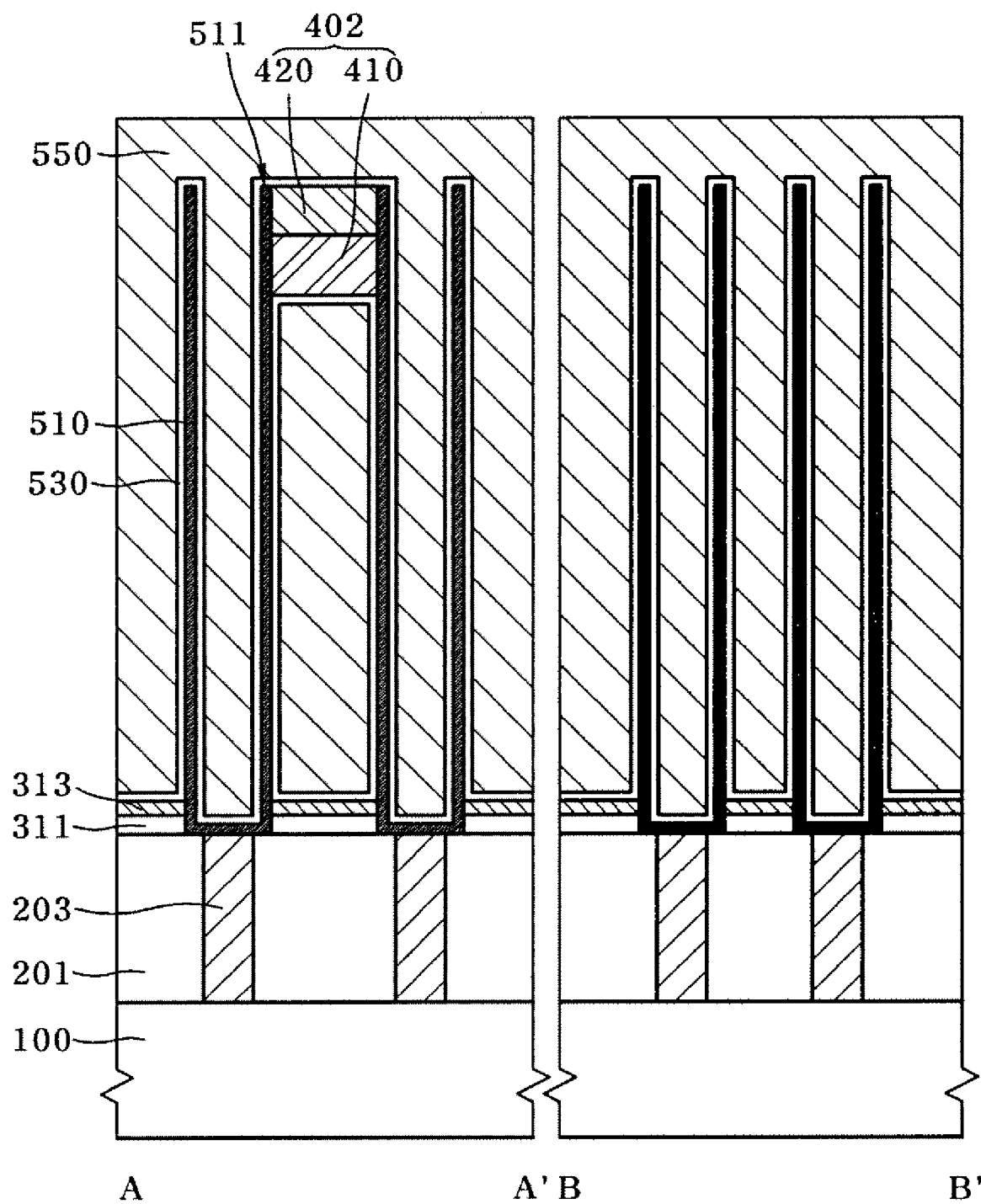
Figure 10:
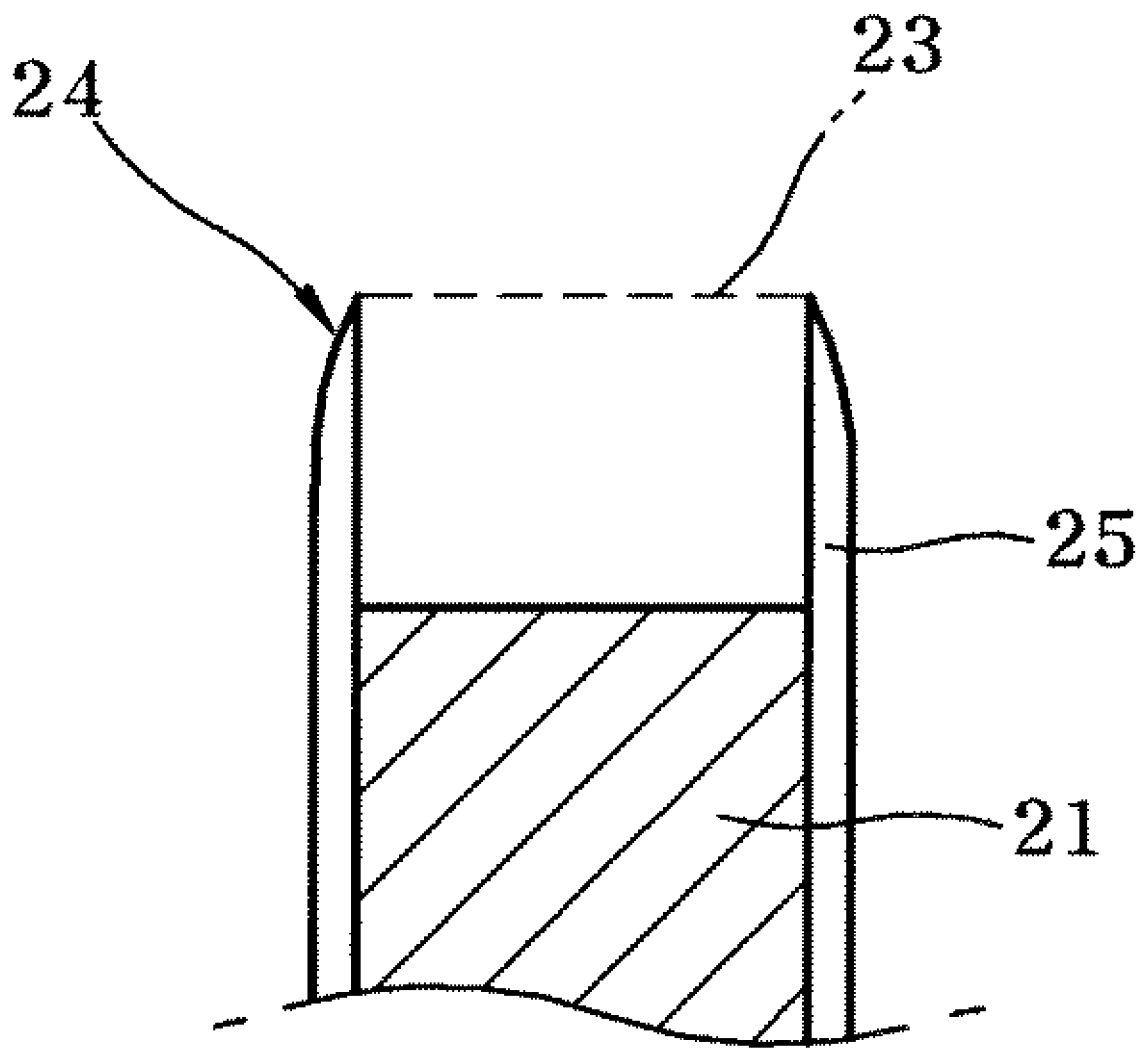
FIG. 10 is a sectional view explaining the effect of the method for fabricating the cylinder type capacitor in accordance with an embodiment of the invention.

Referring to FIG. 9, a dielectric layer 530 is deposited over the storage node 510 and an upper electrode 550 is deposited over the dielectric layer 530, thereby forming a capacitor structure. The dielectric layer 530 can be formed by depositing a high k material such as zirconium oxide ($ZrO_2$), and can also be formed by depositing a layer of aluminum oxide ($Al_2O_3$) between zirconium oxide layers. The upper electrode 550 can be formed including a polysilicon layer, a titanium nitride layer, a ruthenium (Ru) layer, a ruthenium oxide layer, or a stack thereof.

As is apparent from the above description, the disclosed method can prevent generation of a crack of the floated pinning layer due to stress and also prevents the tip of the storage node from forming a horn and breaking. Therefore, it is possible to prevent current leakage of the capacitor and thus can provide a capacitor ensuring a high capacitance more stably.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a cylinder type capacitor, comprising:
   forming connection contacts passing through a lower layer over a semiconductor substrate;
   forming a mold layer covering the connection contacts;
   forming a first floated pinning layer with a stress in a first direction over the mold layer;
   forming a second floated pinning layer for stress relief with a stress in a second direction over the first floated pinning layer, the second direction being opposite to the first direction;
   forming opening holes passing through the first and second floated pinning layers and the mold layer to expose the connection contacts;
   forming storage nodes following a profile of the opening holes;
   removing portions of the first and second floated pinning layers to form a floated pinning layer pattern, the floated pinning layer pattern exposing a portion of the mold layer and contacting upper tips of the storage nodes;
   exposing outer walls of the storage nodes by selectively removing the exposed mold layer; and
   forming a dielectric layer and an upper electrode over the storage node.

2. The method of claim 1, wherein the first floated pinning layer and the second floated pinning layer comprises silicon nitride ($Si_3N_4$) having a different etch rate from that of the mold layer.

3. The method of claim 1, wherein the first floated pinning layer comprises a low pressure nitride layer and the second floated pinning layer comprises a plasma enhanced nitride layer.

4. The method of claim 1, wherein the mold layer comprises a plasma enhanced tetraethylorthosilicate layer.

* * * * *